(12) United States Patent
Zou

(10) Patent No.: US 10,588,242 B1
(45) Date of Patent: Mar. 10, 2020

(54) HEAT DISSIPATING DEVICE AND ELECTRONIC DEVICE HAVING SAME

(71) Applicant: Haoxiong Zou, Guangdong (CN)

(72) Inventor: Haoxiong Zou, Guangdong (CN)

(*) Notice: Subject to any disclaimer, the term of this patent is extended or adjusted under 35 U.S.C. 154(b) by 0 days.

(21) Appl. No.: 16/175,857

(22) Filed: Oct. 31, 2018

(30) Foreign Application Priority Data

Sep. 27, 2018 (CN) .......................... 2018 1 1134495

(51) Int. Cl.
*H05K 7/20* (2006.01)
*H01L 23/473* (2006.01)
*F16J 3/04* (2006.01)
*H01L 23/467* (2006.01)
*H01L 23/38* (2006.01)

(52) U.S. Cl.
CPC ............ *H05K 7/20272* (2013.01); *F16J 3/04* (2013.01); *H01L 23/38* (2013.01); *H01L 23/467* (2013.01); *H01L 23/473* (2013.01); *H05K 7/20154* (2013.01); *H05K 7/20254* (2013.01); *H05K 7/20263* (2013.01)

(58) Field of Classification Search
CPC .................................. H01L 23/473; F16J 3/04
See application file for complete search history.

(56) References Cited

U.S. PATENT DOCUMENTS

| | | | | |
|---|---|---|---|---|
| 764,572 A * | 7/1904 | Fulton | ....................... | F02D 1/00 285/227 |
| 2,613,607 A * | 10/1952 | Sheen | ....................... | F04B 5/00 417/383 |
| 3,401,607 A * | 9/1968 | Wortman | ............... | B05B 13/041 92/120 |
| 3,494,509 A * | 2/1970 | McGuire | ................ | B65D 88/18 222/107 |
| 6,102,777 A * | 8/2000 | Duescher | ................ | B24B 37/04 451/262 |
| 6,312,400 B1 * | 11/2001 | Itikawa | ................... | A61H 7/004 601/100 |
| 6,611,425 B2 * | 8/2003 | Ohashi | ..................... | G06F 1/203 361/679.52 |
| 6,631,717 B1 * | 10/2003 | Rich | .................. | A61M 16/0045 128/204.18 |
| 7,407,000 B2 * | 8/2008 | Lee | ........................... | G06F 1/20 165/104.33 |
| 7,694,723 B2 * | 4/2010 | Ma | ........................... | F04B 43/04 165/120 |
| 7,787,248 B2 * | 8/2010 | Campbell | ............. | H01L 23/427 165/104.33 |

(Continued)

*Primary Examiner* — Robert J Hoffberg

(57) ABSTRACT

A heat dissipating device includes a variable volume unit; a driving unit for driving a volume change of the variable volume unit; and a fluid passage connected to the variable volume unit; wherein the fluid passage includes a heat dissipating section and a heat absorbing section, the variable volume unit and the fluid passage are filled with a liquid coolant; when the driving unit drives the variable volume unit to decrease its volume, the liquid coolant is discharged from the variable volume unit to the fluid passage; when the driving unit drives the variable volume unit to increase its volume, the liquid coolant flows back to the variable volume unit via the fluid passage; the liquid coolant conducts heat to an exterior when it flows through the heat dissipating section, and the liquid coolant absorbs heat from the exterior when it flows through the heat absorbing section.

17 Claims, 14 Drawing Sheets

(56) References Cited

U.S. PATENT DOCUMENTS

| | | | | |
|---|---|---|---|---|
| 7,841,385 B2 * | 11/2010 | Campbell | .......... | H05K 7/20218 |
| | | | | 165/104.33 |
| 7,948,757 B2 * | 5/2011 | Campbell | ............. | H01L 23/427 |
| | | | | 165/104.33 |
| 8,081,454 B2 * | 12/2011 | Ishikawa | ................... | F04F 7/00 |
| | | | | 165/122 |
| 8,230,906 B2 * | 7/2012 | Campbell | .......... | H05K 7/20218 |
| | | | | 165/104.33 |
| 2009/0266084 A1 * | 10/2009 | Radhakrishnan | ....... | F25B 25/00 |
| | | | | 62/3.2 |
| 2017/0191709 A1 * | 7/2017 | Chen | ...................... | F28F 3/022 |

* cited by examiner

HEAT DISSIPATING DEVICE AND ELECTRONIC DEVICE HAVING SAME

CROSS REFERENCE TO RELATED APPLICATION

The present application claims the benefit of Chinese Patent Application No. 201811134495.1 filed on Sep. 27, 2018, the content of which is hereby incorporated by reference.

TECHNICAL FIELD

The present application relates to a heat dissipating device of an electronic device and the electronic device, and more particularly to an ultra-thin heat dissipating device and an electronic device having the same.

BACKGROUND

It is an important trend in consumer electronics such as mobile phones, tablets and laptops to become thinner and lighter. On one hand, the electronic devices are becoming more and more lightweight and portable. On the other hand, performance of the electronic devices is constantly improving, and the amount of heat generated by the core components is increasing consistently, which will bring great challenges to heat dissipation of the electronic devices. Although an active liquid cooling solution is adopted to attempt to dissipate heat in some electronic devices, it is difficult to achieve thin and light heat dissipating device due to restriction of the size and volume of components such as fluid pumps. Therefore, it is difficult to realize commercialization.

SUMMARY

An objective of the present application is to provide a heat dissipating device which allows active liquid cooling to be applied to consumer electronics such as mobile phones, tablets and laptops.

According to an embodiment of the heat dissipating device of the present application, the heat dissipating device includes:
 at least one variable volume unit;
 a driving unit for driving a change in a volume of the variable volume unit; and
 a fluid passage connected to the variable volume unit;
 wherein the fluid passage includes at least one heat dissipating section and one heat absorbing section, and the variable volume unit and the fluid passage are filled with a liquid coolant;
 wherein when the driving unit drives the variable volume unit to decrease the volume of the variable volume unit from large to small, the liquid coolant in the variable volume unit is discharged from the variable volume unit to the fluid passage;
 wherein when the driving unit drives the variable volume unit to increase the volume of the variable volume unit from small to large, the liquid coolant flows back to the variable volume unit via the fluid passage; and
 wherein the liquid coolant conducts heat to an exterior when the liquid coolant flows through the heat dissipating section of the fluid passage, and the liquid coolant absorbs heat from the exterior when the liquid coolant flows through the heat absorbing section of the fluid passage.

According to an embodiment of the heat dissipating device of the present application, the at least one variable volume unit includes a first variable volume unit and a second variable volume unit; the first variable volume unit is coupled to a first end of the fluid passage, the second variable volume unit is coupled to a second end of the fluid passage; the first variable volume unit and the second variable volume unit is interlocked by a drive of the driving unit; and when a volume of the first variable volume unit is decreased from large to small, a volume of the second variable volume unit is increased from small to large.

According to an embodiment of the heat dissipating device of the present application, the variable volume unit includes a first chamber for accommodating the liquid coolant and a second chamber for accommodating air; the fluid passage is connected to the first chamber; the heat dissipating device further includes an air flow passage formed by heat dissipating fins disposed on the heat dissipating section of the fluid passage; and the air flow passage is connected to the second cavity through the air duct;
 when the driving unit drives the variable volume unit to decrease the volume of the variable volume unit from large to small, and the air in the second chamber is discharged from the second chamber to the air flow passage via the air duct;
 and when the drive unit drives the variable volume unit to increase the volume of the variable volume unit from small to large, the air is drawn from the air passage into the second chamber via the air duct.

According to an embodiment of the heat dissipating device of the present application, the variable volume unit is of an accordion box structure; and the variable volume unit includes a side wall formed by a plurality of folded portions.

According to an embodiment of the heat dissipating device of the present application, the drive unit includes a stepper motor and a screw mechanism driven by the stepper motor.

According to an embodiment of the heat dissipating device of the present application, the heat dissipating device further includes an air flow passage formed by heat dissipating fins disposed on the heat dissipating section of the fluid passage, and a fan assembly for promoting air flow through the air flow passage.

According to an embodiment of the heat dissipating device of the present application, the heat dissipating device further includes a solid state cooling component; a cool end of the solid state cooling component is disposed against the heat dissipating section of the fluid passage, and a hot end of the solid state cooling component is disposed against the air flow passage.

According to an embodiment of the heat dissipating device of the present application, the heat dissipating device further includes a heat absorbing plate disposed on the heat absorbing section of the fluid passage.

Another objective of the present application is to provide an electronic device including the above heat dissipating device.

According to an embodiment of the heat dissipating device of the present application, the electronic device includes the heat dissipating device described above, wherein the heat absorbing section of the fluid passage is disposed adjacent to a heat generating component of the electronic device.

According to an embodiment of the heat dissipating device of the present application, the electronic device is a mobile phone, a tablet or a laptop; and the heat generating component is a microprocessor, a power source, a wireless charging component or an internal memory of the electronic device.

The heat dissipating device and the electronic device having the same according to the present application have the following advantageous effects:

Since the heat dissipating device of the present application does not have a fluid pump as in the existing liquid cooling device, lightweight and thinness of the heat dissipating device may be achieved, so that the heat dissipating device may be used in consumer electronics such as mobile phones, tablets and laptops.

BRIEF DESCRIPTION OF THE DRAWINGS

The present application will be further described below in conjunction with the accompanying drawings and embodiments.

DETAILED DESCRIPTION

Figure 1:
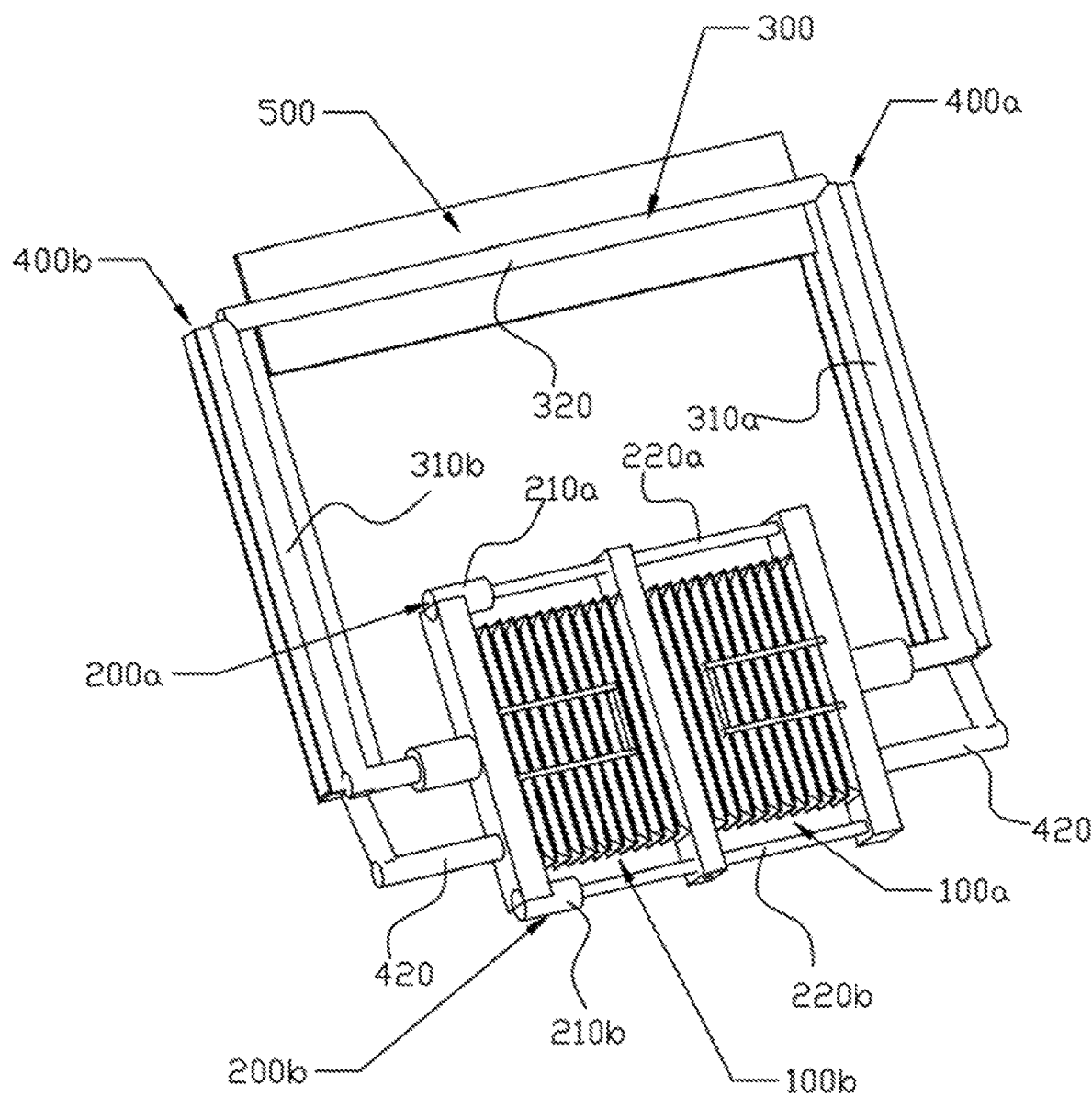
FIG. 1 is a stereoscopic schematic view of a first embodiment of the heat dissipating device according to the present application.
Figure 2:
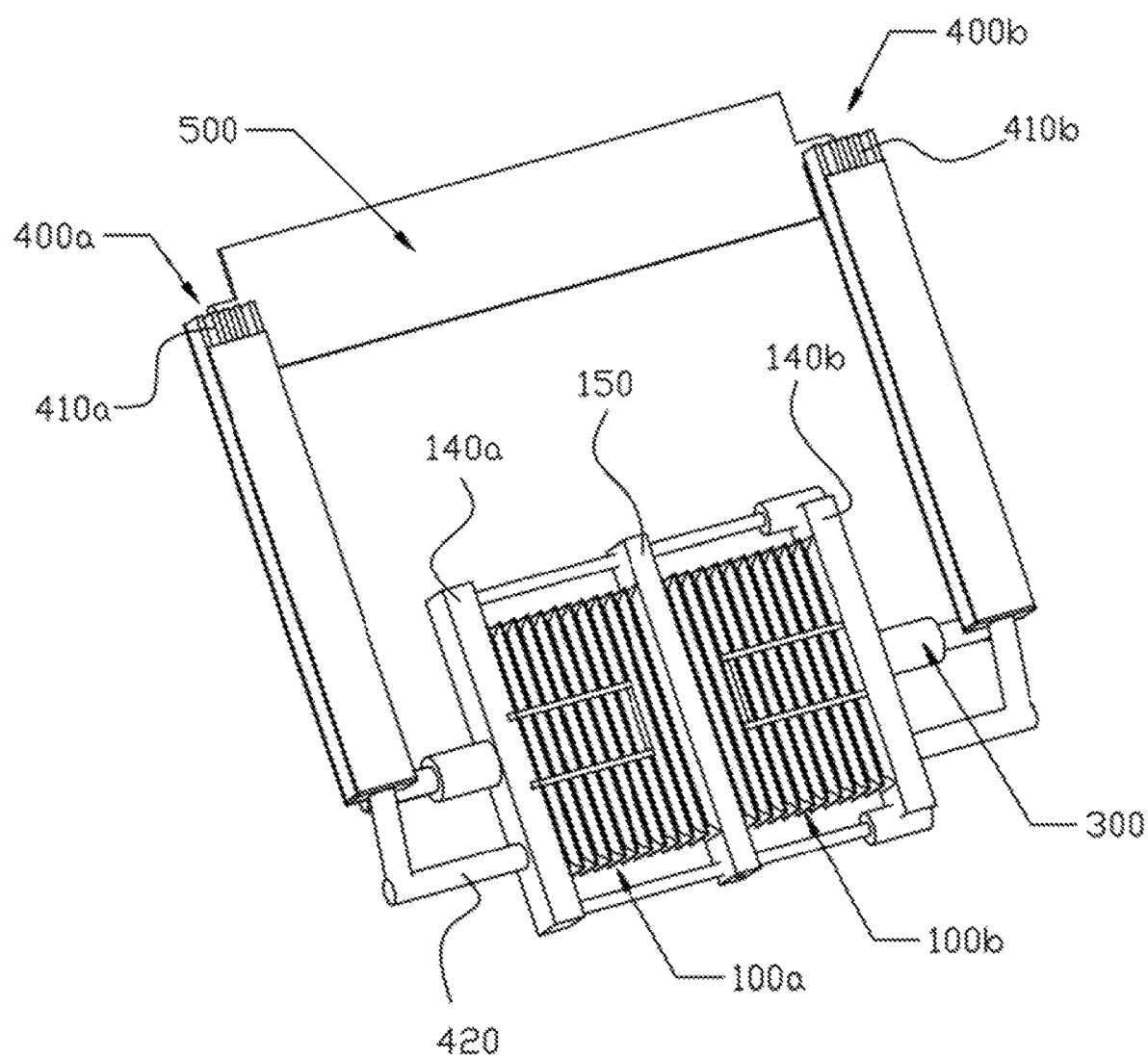
FIG. 2 is a stereoscopic schematic view showing another angle of the first embodiment of the heat dissipating device according to the present application.

For a clear understanding of the technical features, objectives and effects of the heat dissipating device according to the present application, specific embodiments of the present application will now be described in detail with reference to the accompanying drawings.

Embodiments of the heat dissipating device and the electronic device having the heat dissipating device according to the present application are described in detail below, examples of which are shown in the accompanying drawings. Among them, like or similar reference numerals refer to like or similar elements, or elements having the same or similar functions, throughout the following description.

In the description of the heat dissipating device and the electronic device having the heat dissipating device according to the present application, it should be understood that the orientations or positional relationships indicated by terms such as "front", "rear", "above", "below", "upper end", "lower end", "upper portion" and "lower portion" are based on the orientations and positional relationships shown in the drawings, which are solely for the convenience in describing the heat dissipating device according to the present application and simplifying the description. These terms do not indicate or imply that the device or elements referred to must have a specific orientation, or be constructed and operated in a specific orientation. Therefore, these terms should not be interpreted as limitations of the present application. In addition, terms such as "first" and "second" are for illustrative purpose only and should not be interpreted as indicating or implying the relative importance.

FIGS. 1 to 5 are the schematic views of the first embodiment of the heat dissipating device according to the present application. The heat dissipating device of the present application is an active liquid cooling heat dissipating device. In the present embodiment, the heat dissipating device includes two variable volume units 100a and 100b; driving units 200a and 200b for driving the variable volume units 100a and 100b so as to vary the volume of the variable volume units 100a and 100b; and a fluid passage 300 having one end connected to the first variable volume unit 100a and another end connected to the second variable volume unit 100b. The fluid passage 300 and the variable volume units 100a and 100b are filled with a liquid coolant. The fluid passage 300 includes two heat dissipating sections 310a and 310b, and a heat absorbing section 320, wherein the heat dissipating section 310a is adjacent to the first variable volume unit 100a, and the heat dissipating section 310b is adjacent to the second variable volume unit 100b. Air flow passages 400a, 400b formed by heat dissipating fins 410a and 410b are disposed on the heat dissipating sections 310a and 310b. When the air flows through the air flow passages 400a and 400b, heat exchange with the heat dissipating fins 410a and 410b will be performed to remove heat.

Figure 3:
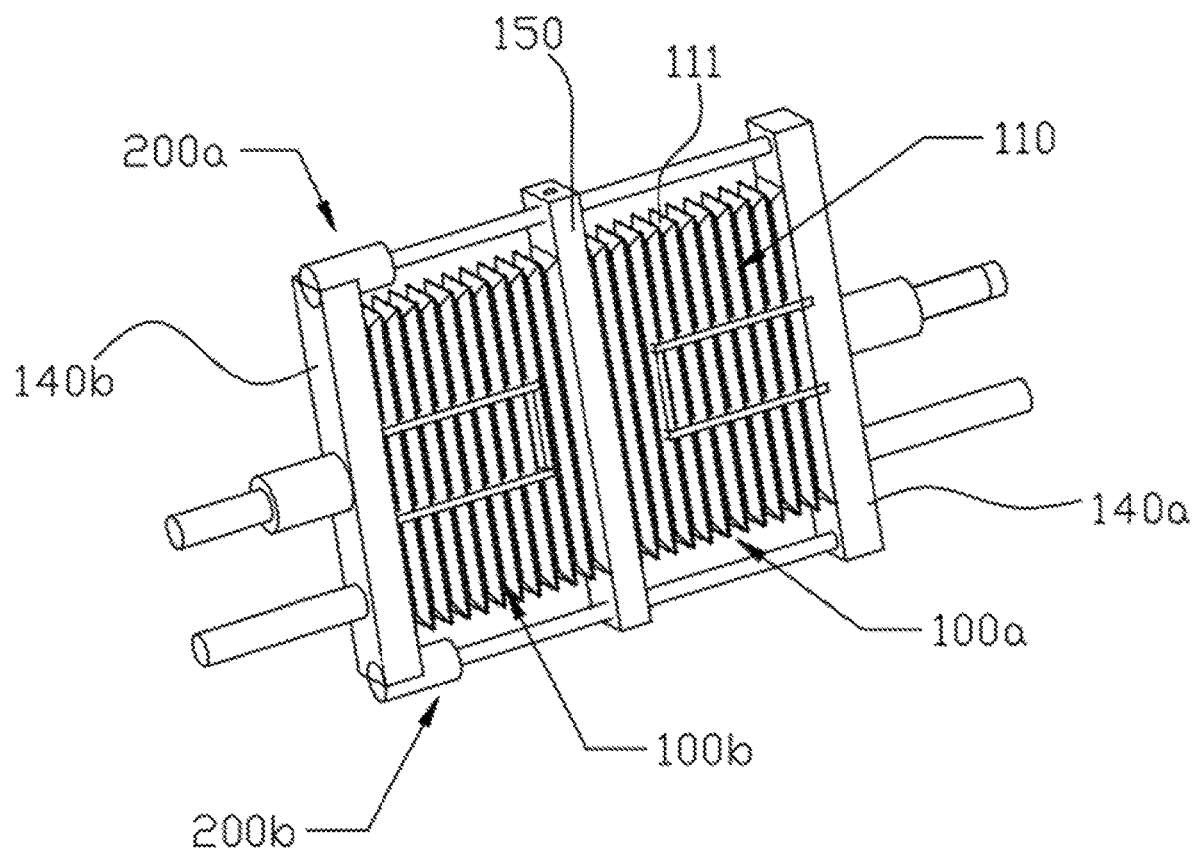
FIG. 3 is a stereoscopic schematic view of a variable volume unit in the first embodiment of the heat dissipating device according to the present application.
Figure 4:
FIG. 4 is a top view of the variable volume unit in the first embodiment of the heat dissipating device according to the present application.
Figure 5:
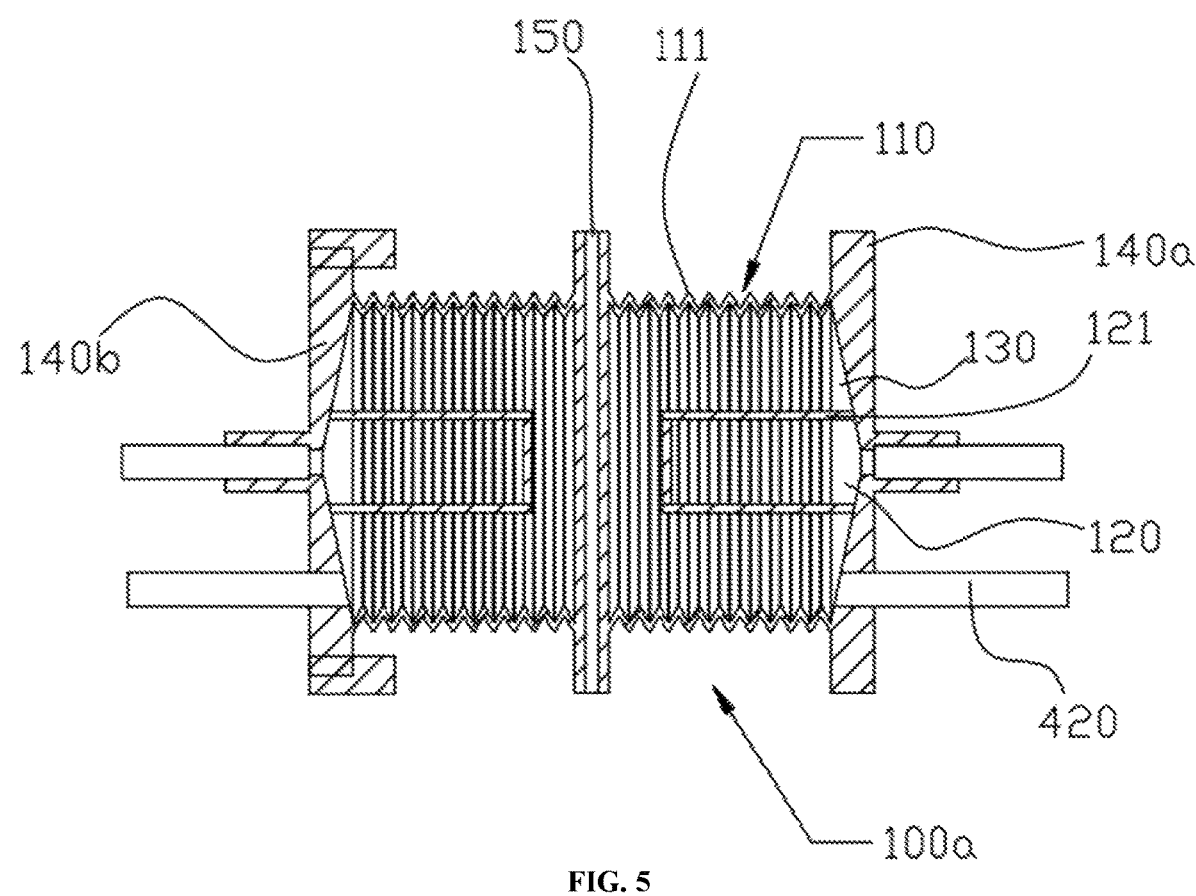
FIG. 5 is a sectional view taken along line A-A of FIG. 4.

Referring to FIG. 3 to FIG. 5, in the present embodiment, the structures of the first variable volume unit 100a and the second variable volume unit 100b are the same. The structure of the variable volume units 100a and 100b are now described by taking the first variable volume unit 100a as an example. In the present embodiment, the first variable volume unit 100a has an accordion box structure including a side wall 110 composed of a plurality of folded portions 111. An interior of the first variable volume unit 100a is partitioned by a partition wall 121 to form two chambers 120 and 130 of which the volumes are variable. The first chamber 120 is for accommodating a liquid coolant, and the second chamber 130 is for accommodating air, wherein the first chamber 120 is connected to the fluid passage 300, and the second chamber 130 is connected to the air flow passage 400 through an air duct 420. When the first variable volume unit 100a is driven by the driving units 200a and 200b, the volume is changed from large to small. That is, when the first variable volume unit 100a is compressed, the liquid coolant in the first chamber 120 is discharged into the fluid passage 300. The liquid coolant flows through the heat dissipating section 310a, the heat absorbing section 320 and the heat dissipating section 310b to the second variable volume unit 100b. When the liquid coolant flows through the heat dissipating sections 310a and 310b, the heat is conducted outward. In the present embodiment, when the heat is conducted to the heat dissipating fins 410a and 410b and the liquid coolant flows through the heat absorbing section 320, the heat is absorbed from the exterior. The heat absorbing section 320 is usually disposed near a heat generating component that needs heat dissipation. For better heat absorption, the heat absorbing section 320 may be provided with heat absorbing plate 500 in order to increase a contact area with the heat generating component that requires heat dissipation, which facilitates heat transfer from the heat generating component to the heat absorbing plate 500 and the liquid coolant. The variable volume units 100a, 100b may be made of materials such as flexible plastic and silicone. The liquid coolant may be water or other conventionally suitable aqueous solutions or liquids.

Referring to FIG. 1 to FIG. 5, in the present embodiment, the first variable volume unit 100a and the second variable volume unit 100b are interlocked under the drive of the driving units 200a and 200b. Specifically, in the present embodiment, the variable volume units 100a and 100b further include front end plates 140a and 140b, and a common rear end plate 150. The driving units 200a and 200b include stepper motors 210a and 210b, and screw mechanisms 220a and 220b driven by the stepper motors 210a and 210b. The screw mechanisms 220a and 220b pass through the rear end plate 150. When the rear end plate 150 moves toward the front end plate 140a of the first variable volume unit 100a, the volume of the first variable volume unit 100a becomes smaller, and the volume of the second variable volume unit 100b becomes larger. The liquid coolant flows from the first chamber 120 of the first variable volume unit 100a to the first chamber of the second variable volume unit 100b. The air in the second chamber 130 of the first variable volume unit 100a flows through the air duct 420 to the air flow passage 400a, while the air is drawn into the second chamber of the second variable volume unit 100b from the air flow passage 400b through the air duct 420. When the air flows through the flow passages 400a and 400b, the heat is exchanged between the air and the heat dissipating fins 410a and 410b. When the rear end plate 150 moves toward the front end plate 140b of the second variable volume unit 100b, the volume of the first variable volume unit 100a becomes larger, and the volume of the second variable volume unit 100b becomes smaller. The liquid coolant flows from the first chamber of the second variable volume unit 100b to the first chamber 120 of the first variable volume unit 100a, while the air is drawn into the second chamber 130 of the first variable volume unit 100a from the air flow passage 400a through the air duct 420. The air in the second chamber of the second variable volume unit 100b flows to the air flow passage 400b through the air duct 420. When the air flows through the flow passages 400a and 400b, the heat is exchanged between the air and the heat dissipating fins 410a and 410b. When the liquid coolant flows back and forth, the heat is conducted to the heat dissipating fins 410a and 410b on the heat dissipating sections 310a and 310b, while the external heat is absorbed by the heat absorbing section 320 through the heat absorbing plate 500.

Comparing to the existing liquid cooling heat dissipating device in which the liquid coolant circulates in a closed loop, the heat dissipating device according to the present embodiment is different in that the liquid coolant flows back and forth between the first variable volume unit 100a and the second variable volume unit 100b via the fluid passage 300, without forming a closed circulation loop. Since a fluid pump is not required, the size of the heat dissipating device may be effectively reduced. In particular, the entire heat dissipating device may be made to be very thin in order to be adopted into thin and portable electronic devices, e.g. the heat dissipating device may be applied to consumer electronics such as mobile phones, tablets and laptops.

It should be understood that in the heat dissipating device of the present application, there may be one or more variable volume units, and the number of variable volume units is not limited to two. Moreover, the two or more variable volume units do not have to be interlocked. In addition, the variable volume unit does not have to be an accordion box structure, but may also be a piston and a piston chamber mechanism in which the volume is changed by changing the position of the piston.

It should be understood that, in the heat dissipating device of the present application, the driving unit for driving the variable volume unit is not limited to the stepping motor and the screw mechanism described in the above embodiment, but may be other conventionally applicable linear driving components such as hydraulic cylinder. In addition, the air flow passage formed by the heat dissipating fins on the heat dissipating section of the fluid passage may also be replaced by carbon nanotubes or other heat exchange combinations, and may be any other conventional applicable heat dissipating structure, but is not limited to the specific structures described in the above embodiment.

Figure 6:
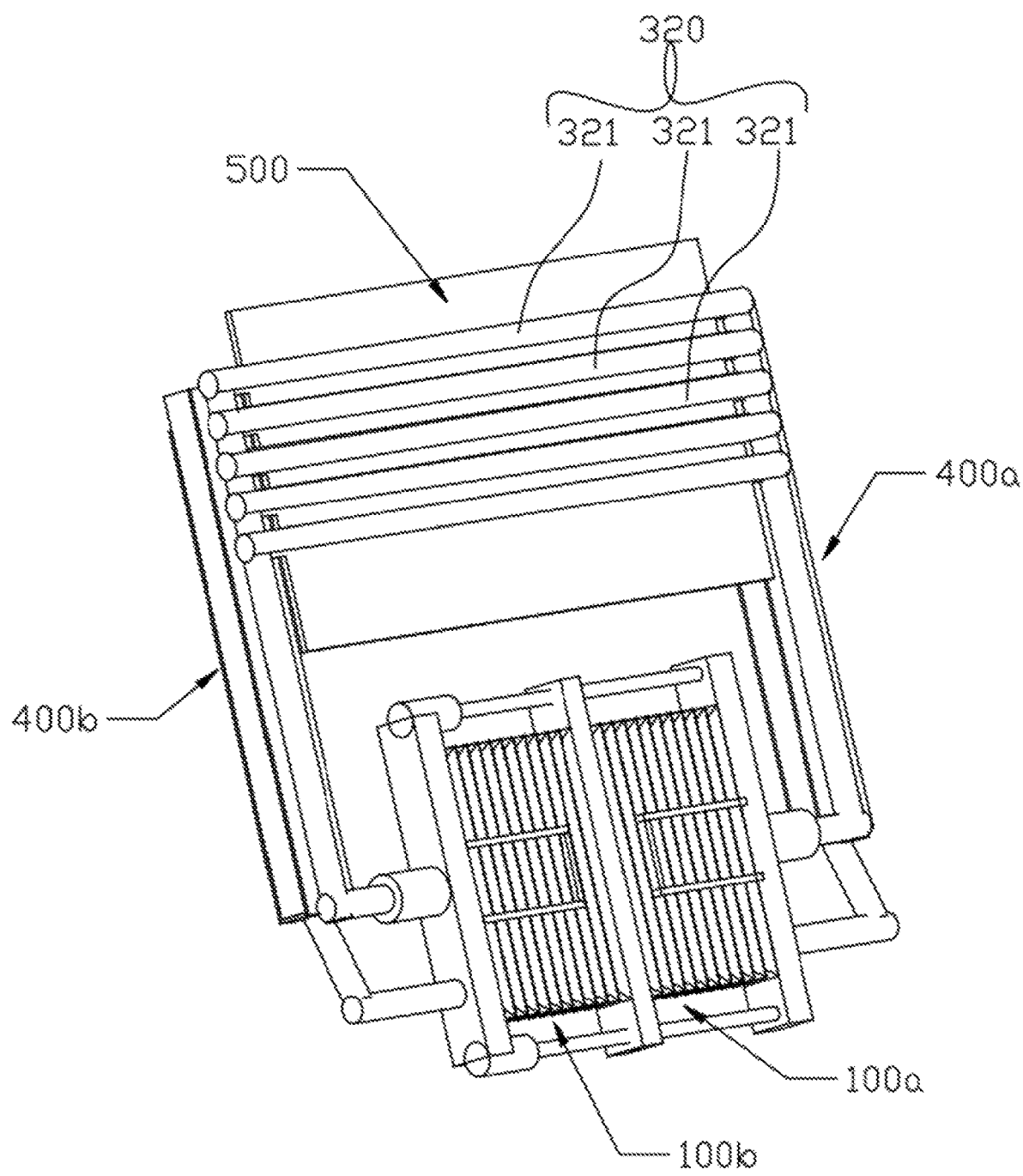
FIG. 6 is a stereoscopic schematic view of a second embodiment of the heat dissipating device according to the present application.

FIG. 6 shows the schematic view of the second embodiment of the heat dissipating device according to the present application. The present embodiment is further improved on the basis of the first embodiment. Specifically, the heat absorbing section 320 of the fluid passage 300 is composed of a plurality of parallel heat absorbing passages 321. In this way, the heat exchange area is increased, thereby increasing the efficiency of heat exchange. The other structures of the heat dissipating device of the present embodiment is the same as those of the heat dissipating device of the first embodiment, and therefore will not be described again.

Figure 7:
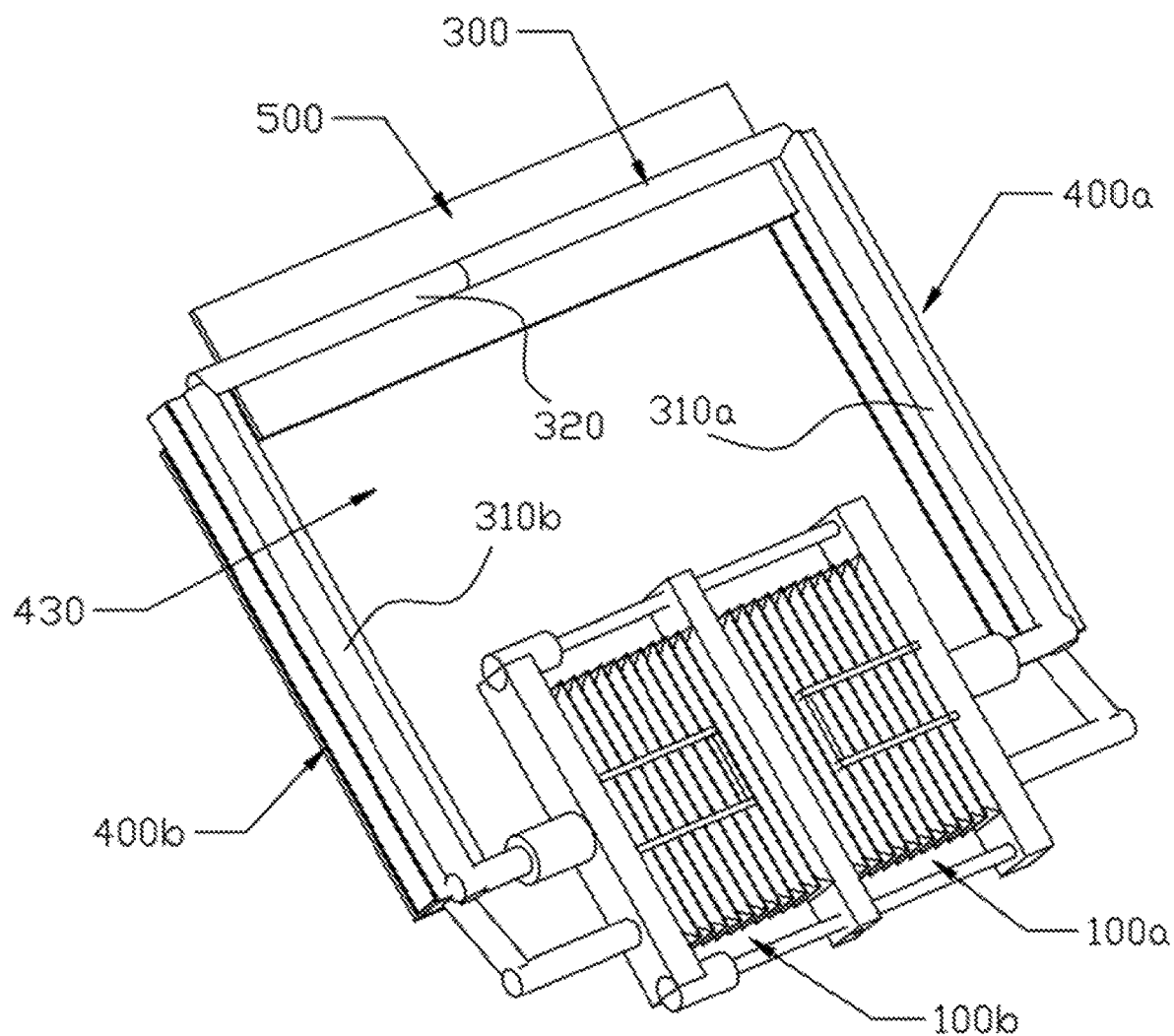
FIG. 7 is a stereoscopic schematic view of a third embodiment of the heat dissipating device according to the present application.
Figure 8:
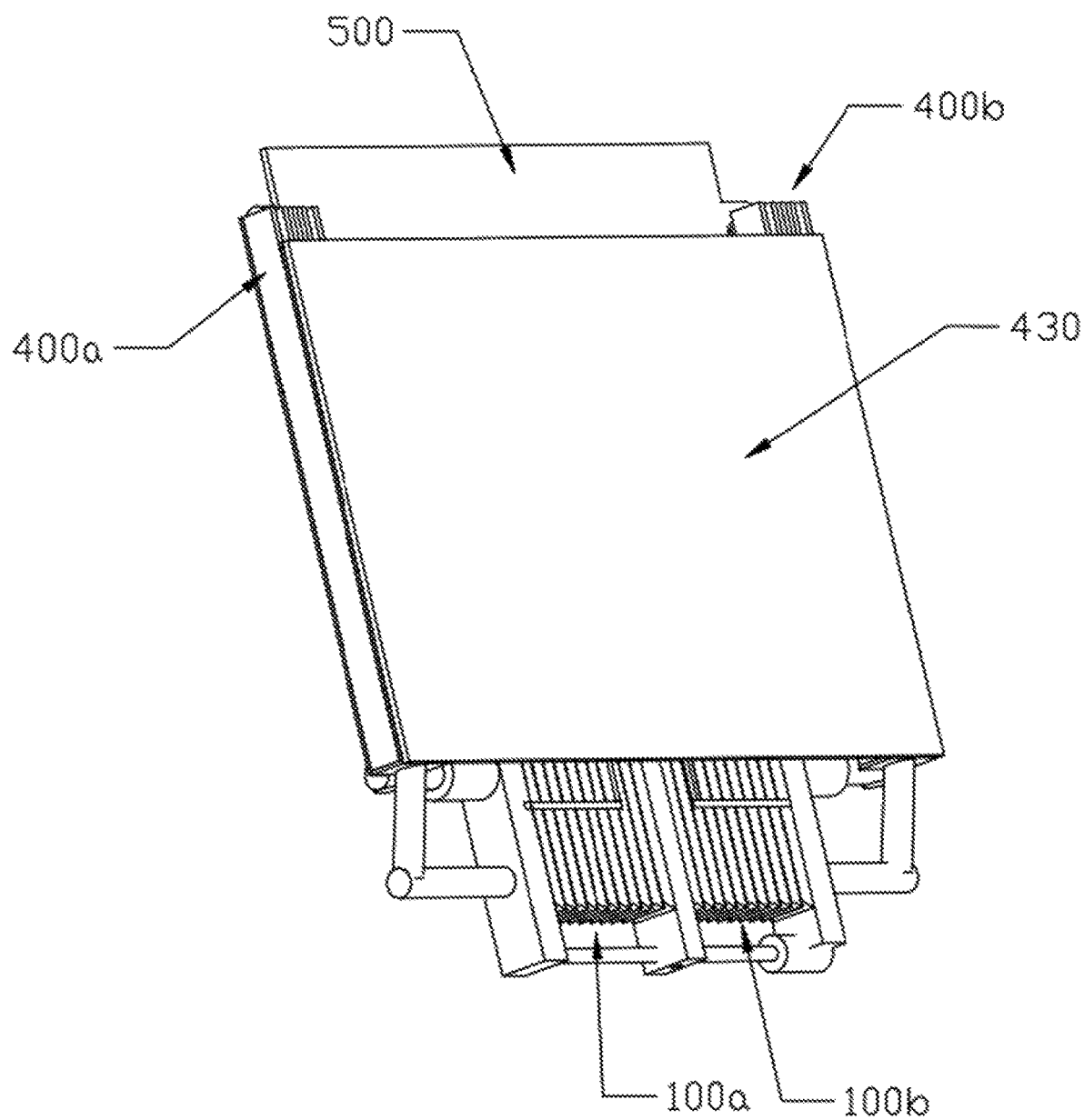
FIG. 8 is a stereoscopic schematic view showing another angle of the third embodiment of the heat dissipating device according to the present application.

FIGS. 7 and 8 show the schematic view of the third embodiment of the heat dissipating device according to the present application. The present embodiment is further improved on the basis of the first embodiment. Specifically, the heat dissipating fins 410a and 410b are in contact with a housing 430 of the electronic device to form the air flow passages 400a and 400b. This is advantageous for dissipating heat to the exterior through the housing of the electronic device, particularly a metal housing, thereby facilitating better outward heat conduction when the liquid coolant flows through the heat dissipating sections 310a and 310b of the fluid passage 300.

Figure 9:
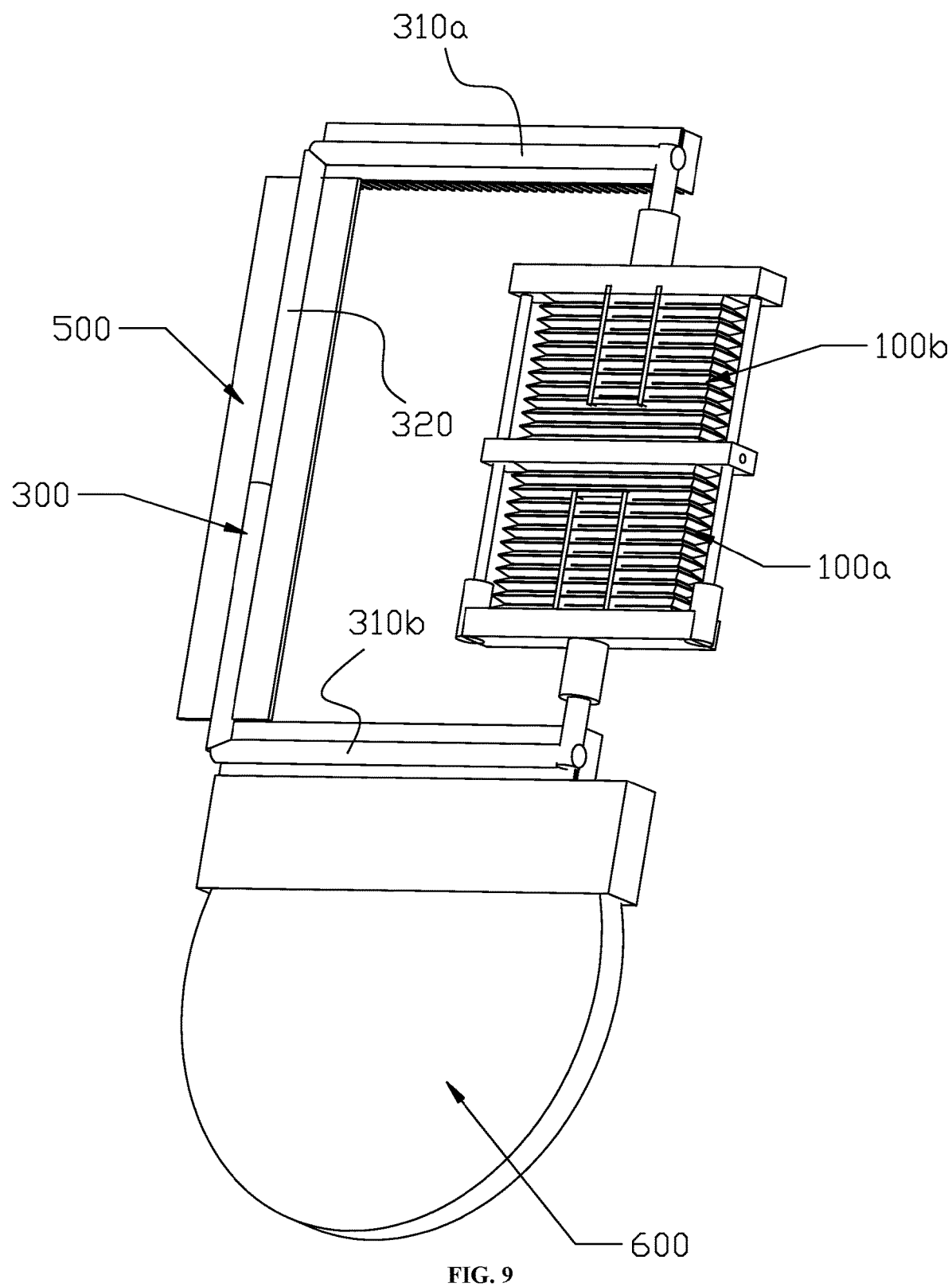
FIG. 9 is a stereoscopic schematic view of a fourth embodiment of the heat dissipating device according to the present application.
Figure 10:
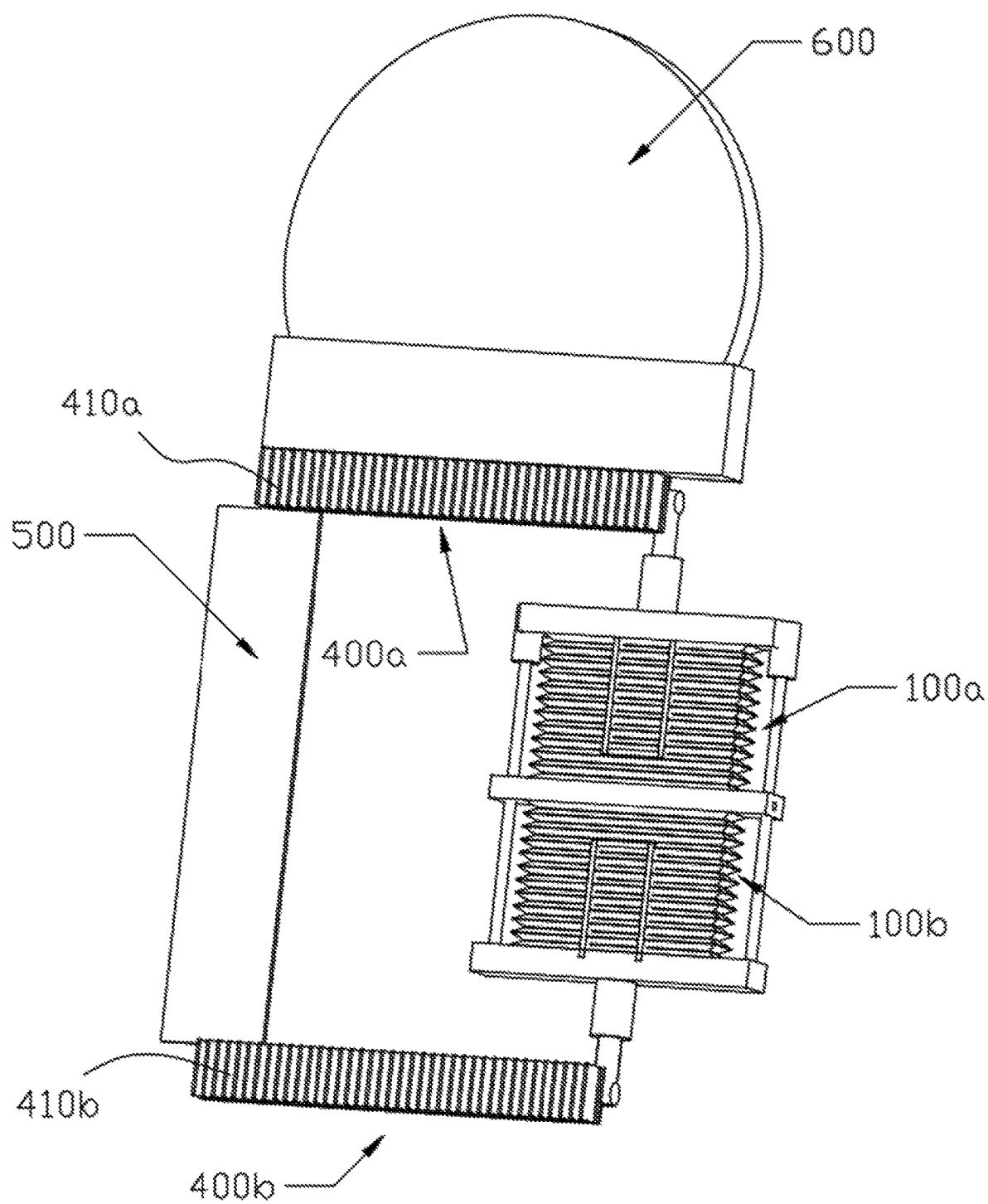
FIG. 10 is a stereoscopic schematic view showing another angle of the fourth embodiment of the heat dissipating device according to the present application.

FIGS. 9 and 10 are schematic views of the fourth embodiment of the heat dissipating device according to the present application. In the present embodiment, the heat dissipating device includes two interlocked variable volume units 100a and 100b, and a fluid passage 300 connected to the two variable volume units 100a and 100b. The fluid passage 300 includes two heat dissipating sections 310a and 310b, and a heat absorbing section 320. The heat absorbing section 320 is provided with a heat absorbing plate 500. The heat dissipating sections 310a and 310b are provided with air flow passages 400a and 400b formed by heat dissipating fins 410a and 410b. One side of the air flow passage 400a is provided with a fan assembly 600 for facilitating air flow through the air flow passages 400a and 400b, thereby performing heat exchange between the air and the heat dissipating fins 410a and 410b and increasing efficiency of heat dissipation. In the present embodiment, since a fan is adopted for dissipating heat from the heat dissipating fins 410a and 410b, the second chamber for accommodating the air is no longer provided in the variable volume units 100a and 100b.

Figure 11:
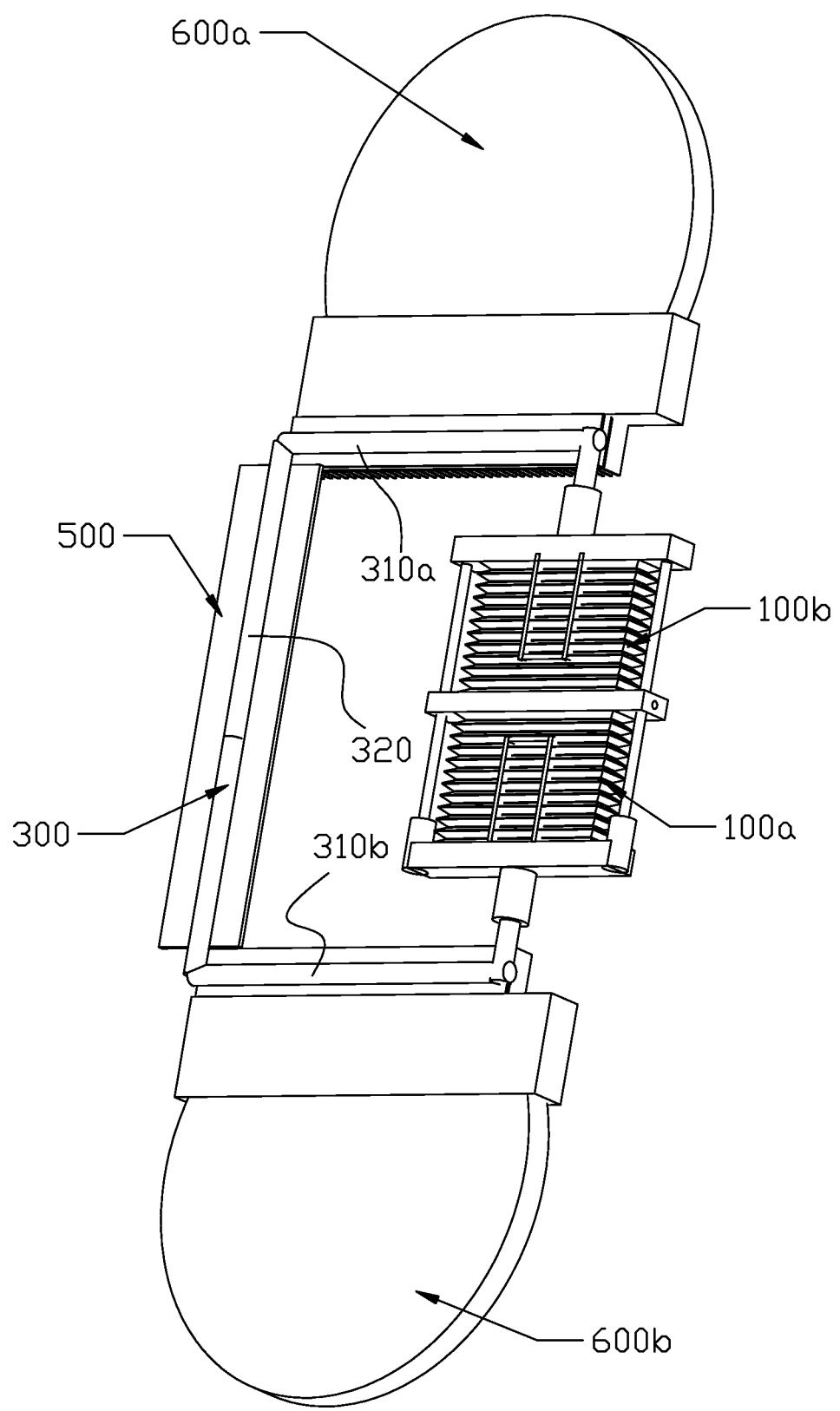
FIG. 11 is a stereoscopic schematic view of a fifth embodiment of the heat dissipating device according to the present application.
Figure 12:
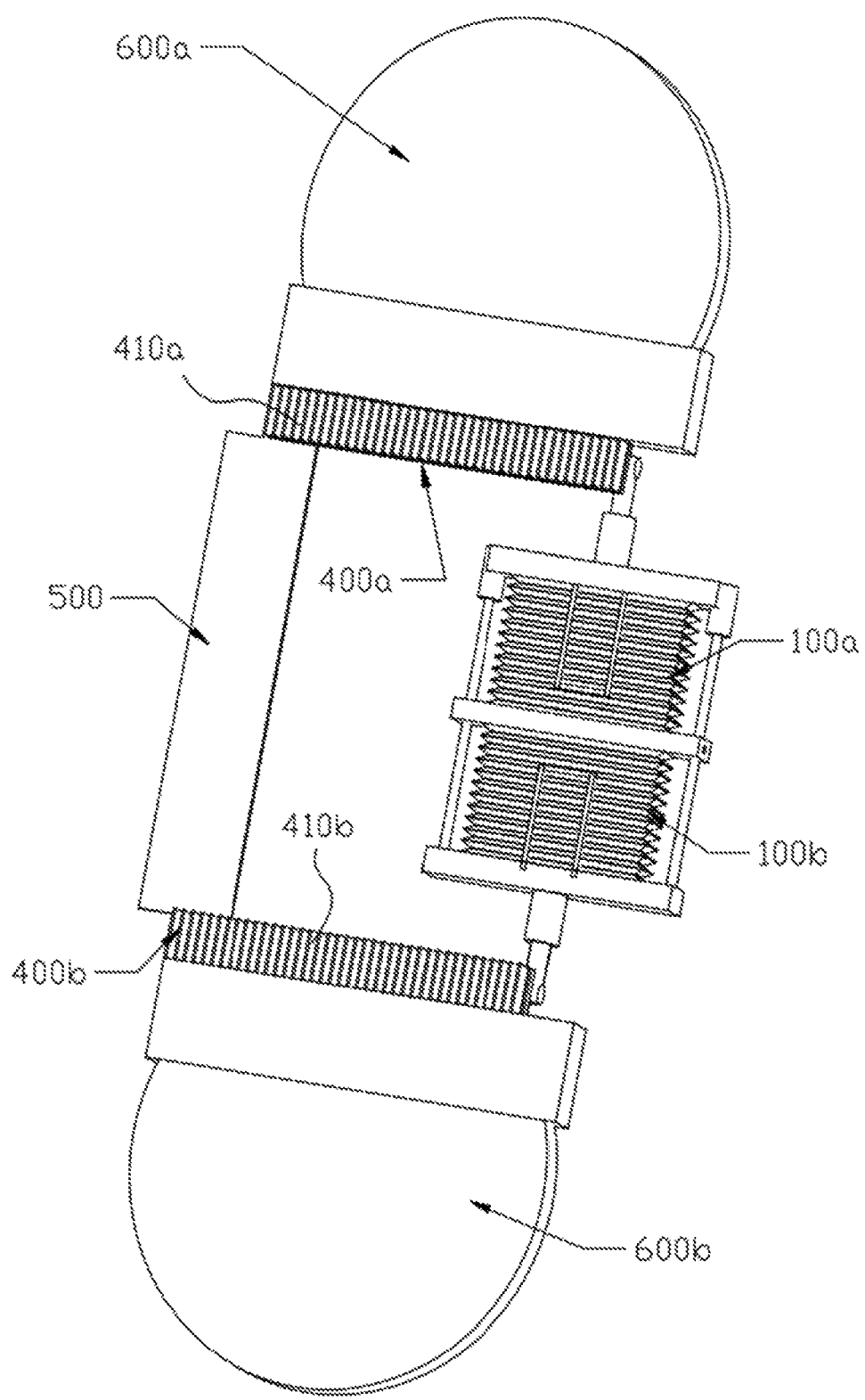
FIG. 12 is a stereoscopic schematic view showing another angle of the fifth embodiment of the heat dissipating device according to the present application.
Figure 13:
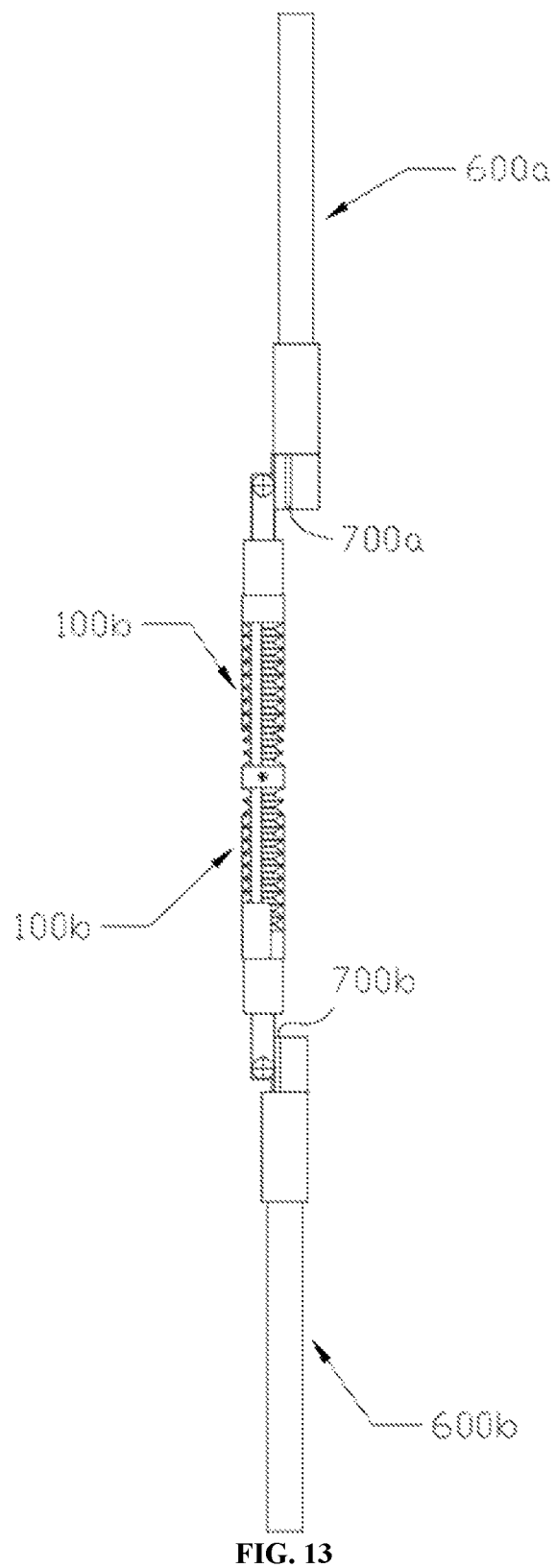
FIG. 13 is a schematic diagram of a side view of the fifth embodiment of the heat dissipating device according to the present application.

FIGS. 11-13 show the schematic views of the fifth embodiment of the heat dissipating device according to the present application. The present embodiment is further improved on the basis of the fourth embodiment. A fan assembly 600b is added to one side of the heat dissipating section 310b of the fluid passage 300. Moreover, solid state cooling components 700a and 700b are also added to the heat dissipating sections 310a and 310b. The cool end of the solid state cooling components 700a and 700b is disposed against the heat dissipating sections 310a and 310b of the fluid passage 300. The hot end of the solid state cooling components 700a and 700b is disposed against the air flow passages 400a and 400b. The solid state cooling components 700a and 700b may be a semiconductor cooling component, a magnetocaloric cooling component or an electrothermal cooling component. The solid state cooling components 700a and 700b may further lower the temperature of the liquid coolant flowing through the heat dissipating sections 310a and 310b, and may enhance the heat dissipating effect of the heat dissipating device. However, due to the presence of the solid state cooling components and the fan assembly, the size of the heat dissipating device may increase.

Figure 14:
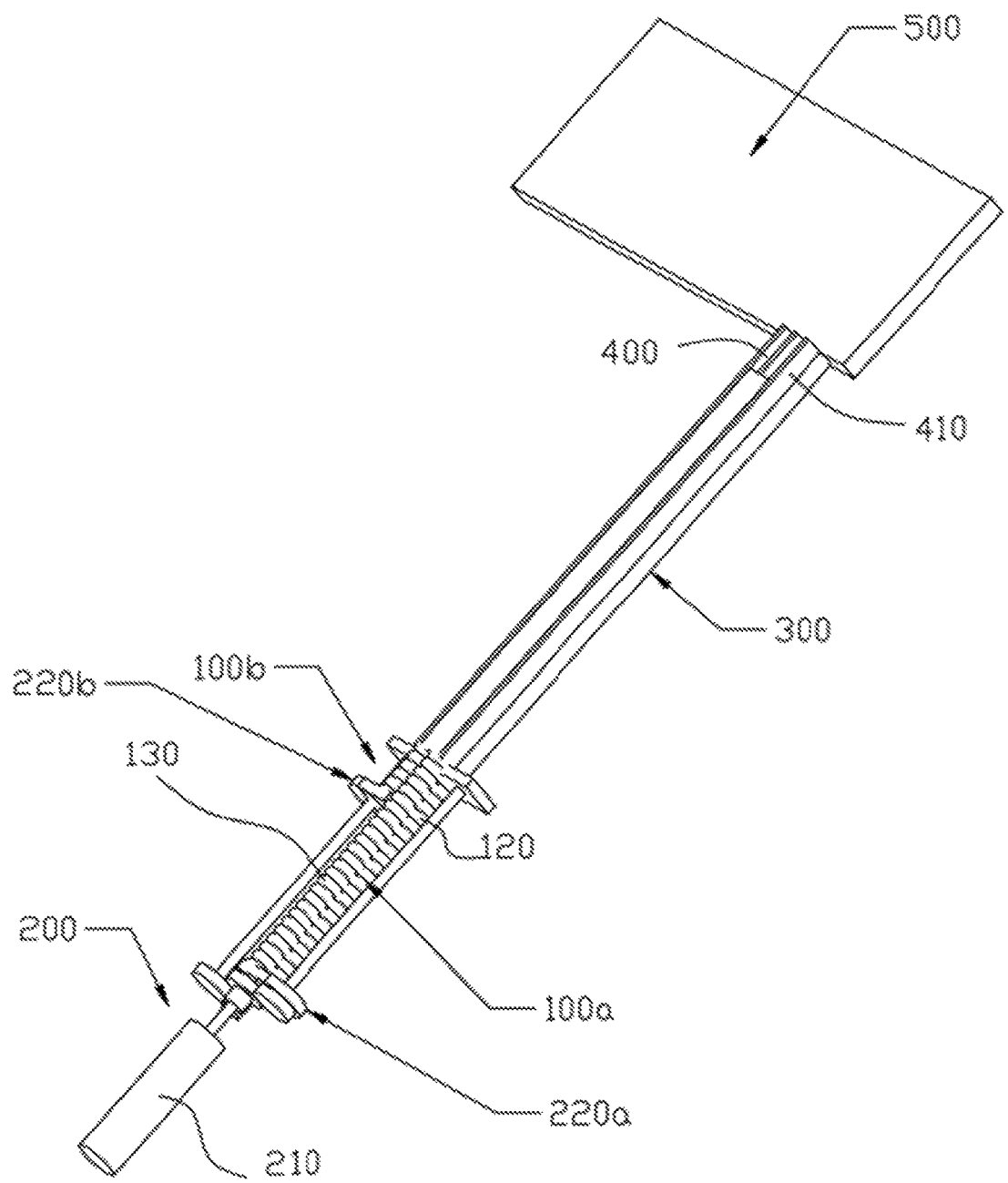
FIG. 14 is a stereoscopic schematic view of a sixth embodiment of the heat dissipating device according to the present application.
Figure 15:
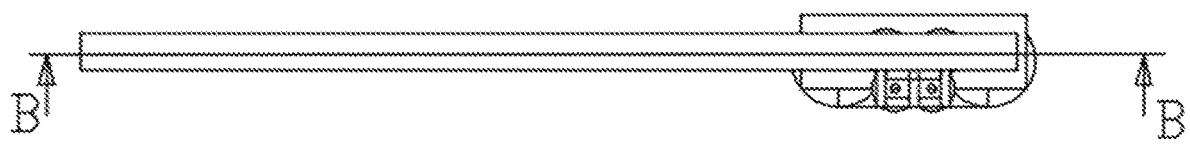
FIG. 15 is a top view of the sixth embodiment of the heat dissipating device according to the present application.
Figure 16:
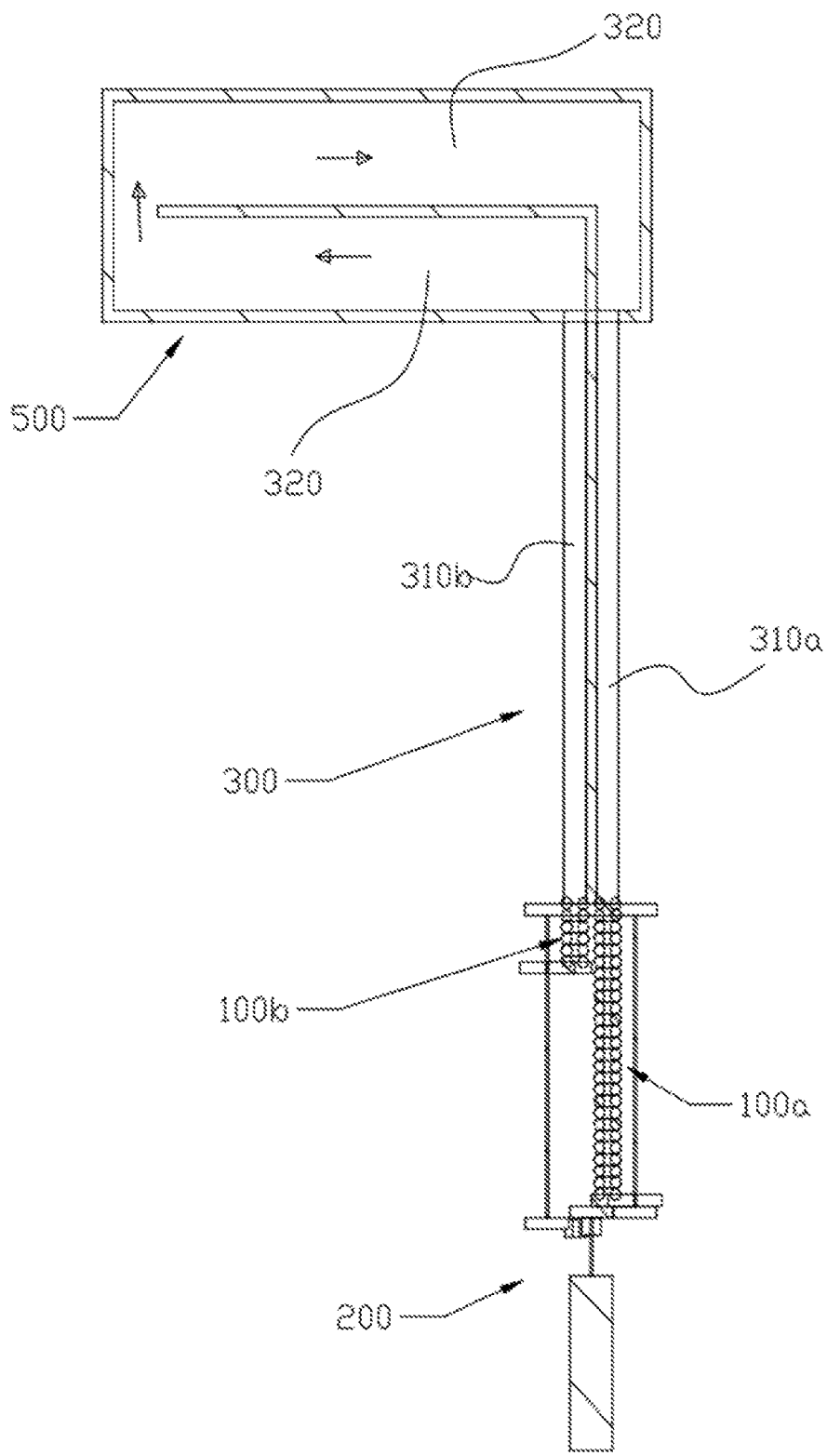
FIG. 16 is a sectional view taken along line B-B of FIG. 15.

FIGS. 14-16 show the schematic views of the sixth embodiment of the heat dissipating device according to the present application. The structure of the heat dissipating device of the present embodiment is more compact. In the present embodiment, the driving unit 200 drives the first variable volume unit 100a and the second variable volume unit 100b in a single motor driving manner. The first variable volume unit 100a and the second variable volume unit 100b are interlocked. Specifically, the motor 210 of the driving unit 200 drives the two screw mechanisms 220a and 220b through a gear set, wherein the first screw mechanism 220a is used for driving the first variable volume unit 100a, and the second screw mechanism 220b is used for driving the second variable volume unit 100b. The first variable volume unit 100a is taken as an example to illustrate the structure of the variable volume unit. The first variable volume unit 100a includes two independent chambers, namely the first chamber 120 and the second chamber 130. Both the first chamber 120 and the second chamber 130 are formed by a foldable cylinder with an annularly folded wall, wherein the first chamber 120 is filled with a liquid coolant, and the second chamber 130 is filled with air. The first chamber 120 is connected to the fluid passage 300. The second chamber 130 is connected to the air flow passage 400. The air flow passage 400 is formed by the heat dissipating fins 410. In the present embodiment, the two heat dissipating sections 310a and 310b of the fluid passage 300 are disposed in parallel, and the heat absorbing section 320 of the fluid passage 300 is directly formed inside the heat absorbing plate 500 in order to facilitate heat exchange.

The heat dissipating device of the present application may be applied to various consumer electronics, such as mobile phones, tablets and laptops. The heat dissipating devices of the fourth and fifth embodiments have improved heat dissipating capability due to the addition of the fan assembly, but the size will be increased. The heat dissipating devices of the fourth and fifth embodiments are suitable for electronic devices with relatively high power and high heat generation. The heat dissipation devices of the first to third embodiments are suitable for use in electronic devices having lower power but higher requirements for lightweight and thinness.

In addition to the above heat dissipating devices, the present application further provides an electronic device having the above heat dissipating devices.

According to an embodiment of the electronic device of the present application, the electronic device is internally provided with the heat dissipating device as described above. The heat absorbing section of the fluid passage is disposed in close proximity to the heat generating component of the electronic device.

According to an embodiment of the heat dissipating device of the present application, the electronic device is a consumer electronic device such as a mobile phone, a tablet or a laptop. The heat generating component is a microprocessor, a power source, a wireless charging component or an internal memory of the electronic device, which generates a relatively large amount of heat. The components, however, is not limited to the above components and may also be other heat generating components that require heat dissipation.

It should be understood that the heat dissipating device of the present application is not limited to being disposed inside the electronic device, but may also be disposed outside the electronic device.

While the embodiments of the present application have been described with reference to the accompanying drawings, the present application is not limited to the specific embodiments described above. The specific embodiments described above are merely illustrative and not restrictive. It will be apparent to one skilled in the art that various changes may be made without departing from the gist of the present application and the scope as defined by the appended claims, which are within the scope of the present application.

What is claimed is:

1. A heat dissipating device comprising:
    a first variable volume unit and a second variable volume unit;
    a driving unit for driving a change in a volume of the first variable volume unit and a volume of the second variable volume unit; and
    a fluid passage connected to the first variable volume unit and the second variable volume unit;
    wherein the fluid passage comprises a heat dissipating section and a heat absorbing section, and the first variable volume unit and the second variable volume unit and the fluid passage are filled with a liquid coolant;
    wherein the first variable volume unit is coupled to a first end of the fluid passage, the second variable volume unit is coupled to a second end of the fluid passage;
    wherein the first variable volume unit and the second variable volume unit are interlocked by a drive of the driving unit;
    wherein when the volume of the first variable volume unit is decreased, the volume of the second variable volume unit is increased, the liquid coolant flows from the first variable volume unit to the second variable volume unit;
    wherein when the volume of the first variable volume unit is increased, the volume of the second variable volume unit is decreased, the liquid coolant flows from the second variable volume unit to the first variable volume unit;

wherein the liquid coolant flows back and forth between the first variable volume unit and the second variable volume unit via the fluid passage; and wherein the liquid coolant absorbs heat from an exterior when the liquid coolant flows through the heat absorbing section of the fluid passage, and the liquid coolant conducts the heat to the exterior when the liquid coolant flows through the heat dissipating section of the fluid passage.

2. The heat dissipating device according to claim 1, wherein each of the first variable volume unit and the second variable volume unit comprises a first chamber for accommodating the liquid coolant and a second chamber for accommodating air; the fluid passage is connected to the first chamber; the heat dissipating device further comprises an air flow passage formed by heat dissipating fins disposed on the heat dissipating section of the fluid passage; and the air flow passage is connected to the second chamber through an air duct;

wherein when the driving unit drives the first variable volume unit to decrease the volume of the first variable volume unit, and the air in the second chamber of the first variable volume unit is discharged from the second chamber to the air flow passage via the air duct; and wherein when the drive unit drives the first variable volume unit to increase the volume of the first variable volume unit, the air is drawn from the air flow passage into the second chamber of the first variable volume unit via the air duct.

3. The heat dissipating device according to claim 1, wherein each of the first variable volume unit and the second variable volume unit is of an accordion box structure; and each of the first variable volume unit and the second variable volume unit comprises a side wall formed by a plurality of folded portions.

4. The heat dissipating device according to claim 1, wherein the drive unit comprises a stepper motor and a screw mechanism driven by the stepper motor.

5. The heat dissipating device according to claim 1, further comprising an air flow passage formed by heat dissipating fins disposed on the heat dissipating section of the fluid passage, and a fan assembly for promoting air flow through the air flow passage.

6. The heat dissipating device according to claim 5, further comprising a solid state cooling component; a cool end of the solid state cooling component is disposed against the heat dissipating section of the fluid passage, and a hot end of the solid state cooling component is disposed against the air flow passage.

7. The heat dissipating device according to claim 1, further comprising a heat absorbing plate disposed on the heat absorbing section of the fluid passage.

8. An electronic device comprising the heat dissipating device according to claim 1, wherein the heat absorbing section of the fluid passage is disposed adjacent to a heat generating component of the electronic device.

9. The electronic device according to claim 8, wherein the electronic device is a mobile phone, a tablet or a laptop; and the heat generating component is a microprocessor, a power source, a wireless charging component or an internal memory of the electronic device.

10. A heat dissipating device comprising:
at least one variable volume unit;
a driving unit for driving a change in a volume of the variable volume unit; and
a fluid passage connected to the at least one variable volume unit;

wherein the fluid passage comprises at least one heat dissipating section and one heat absorbing section, and the at least one variable volume unit and the fluid passage are filled with a liquid coolant;

wherein when the driving unit drives the at least one variable volume unit to decrease a volume of the at least one variable volume unit, the liquid coolant in the at least one variable volume unit is discharged from the at least one variable volume unit to the fluid passage;

wherein when the driving unit drives the at least one variable volume unit to increase the volume of the at least one variable volume unit, the liquid coolant flows back to the at least one variable volume unit via the fluid passage; and wherein the liquid coolant absorbs heat from an exterior when the liquid coolant flows through the at least one heat absorbing section of the fluid passage, and the liquid coolant conducts the heat to the exterior when the liquid coolant flows through the at least one heat dissipating section of the fluid passage;

wherein each of the at least one variable volume unit comprises a first chamber for accommodating the liquid coolant and a second chamber for accommodating air; the fluid passage is connected to the first chamber; the heat dissipating device further comprises an air flow passage formed by heat dissipating fins disposed on the at least one heat dissipating section of the fluid passage; and the air flow passage is connected to the second chamber through an air duct;

wherein when the driving unit drives the at least one variable volume unit to decrease the volume of the at least one variable volume unit, and the air in the second chamber is discharged from the second chamber to the air flow passage via the air duct; and wherein when the drive unit drives the at least one variable volume unit to increase the volume of the at least one variable volume unit, the air is drawn from the air flow passage into the second chamber via the air duct.

11. The heat dissipating device according to claim 10, wherein the at least one variable volume unit is of an accordion box structure; and the at least one variable volume unit comprises a side wall formed by a plurality of folded portions.

12. The heat dissipating device according to claim 10, wherein the drive unit comprises a stepper motor and a screw mechanism driven by the stepper motor.

13. The heat dissipating device according to claim 10, further comprising an air flow passage formed by heat dissipating fins disposed on the at least one heat dissipating section of the fluid passage, and a fan assembly for promoting air flow through the air flow passage.

14. The heat dissipating device according to claim 13, further comprising a solid state cooling component; a cool end of the solid state cooling component is disposed against the at least one heat dissipating section of the fluid passage, and a hot end of the solid state cooling component is disposed against the air flow passage.

15. The heat dissipating device according to claim 10, further comprising a heat absorbing plate disposed on the one heat absorbing section of the fluid passage.

16. An electronic device comprising the heat dissipating device according to claim 10, wherein the one heat absorbing section of the fluid passage is disposed adjacent to a heat generating component of the electronic device.

17. The electronic device according to claim 16, wherein the electronic device is a mobile phone, a tablet or a laptop; and the heat generating component is a microprocessor, a power source, a wireless charging component or an internal memory of the electronic device.

\* \* \* \* \*